United States Patent [19]

Nishizawa et al.

[11] Patent Number: 4,956,599
[45] Date of Patent: Sep. 11, 1990

[54] POWER CONTROL APPARATUS

[75] Inventors: Jun-ichi Nishizawa; Takashige Tamamushi, both of Sendai; Koji Ishibashi; Kiyoshi Wagatsuma, both of Tagajo, all of Japan

[73] Assignees: Tohoku Electric Manufacturing Co., Ltd., Tagajo; Zaidan Hojin Handotai Kenkyu Sinkokai, Sendai, both of Japan

[21] Appl. No.: 298,900

[22] Filed: Jan. 19, 1989

[30] Foreign Application Priority Data

Jan. 22, 1988 [JP] Japan .................................. 63-12096

[51] Int. Cl.⁵ ............................................. G05F 1/455
[52] U.S. Cl. ..................................... 323/244; 323/902
[58] Field of Search ............... 323/205, 207, 212, 235, 323/236, 239, 241, 244, 299, 300, 319, 320, 322, 902

[56] References Cited
U.S. PATENT DOCUMENTS 4,271,387  6/1981  Mukai et al. ......................... 323/241
4,289,948  9/1981  Jurek et al. ......................... 323/300 X
4,308,494 12/1981  Gelfand et al. ..................... 323/244 X
4,709,320 11/1987  Konopka ............................ 323/902 X
4,791,545 12/1988  Hinckley ........................... 323/235 X

OTHER PUBLICATIONS

Maruhashi et al., "AC Constant Voltage Regulator by Improved Partial Voltage Phase-Control Technique", *Electrical Engineering in Japan,* pp. 47-54, 7/75.

*Primary Examiner*—Steven L. Stephan
*Assistant Examiner*—Kristine Peckman
*Attorney, Agent, or Firm*—Oblon, Spivak, McClelland, Maier & Neustadt

[57] ABSTRACT

A pair of static induction thyristors, which are coupled in parallel in the opposite bias directions between an AC power source and a load, is turned on by a light signal and is turned off by natural commutation, a light signal or an electric signal. The turn-off light signal is generated within a phase angle of 90° in the time axis around the zero-cross point of the AC voltage from the AC power source.

4 Claims, 20 Drawing Sheets

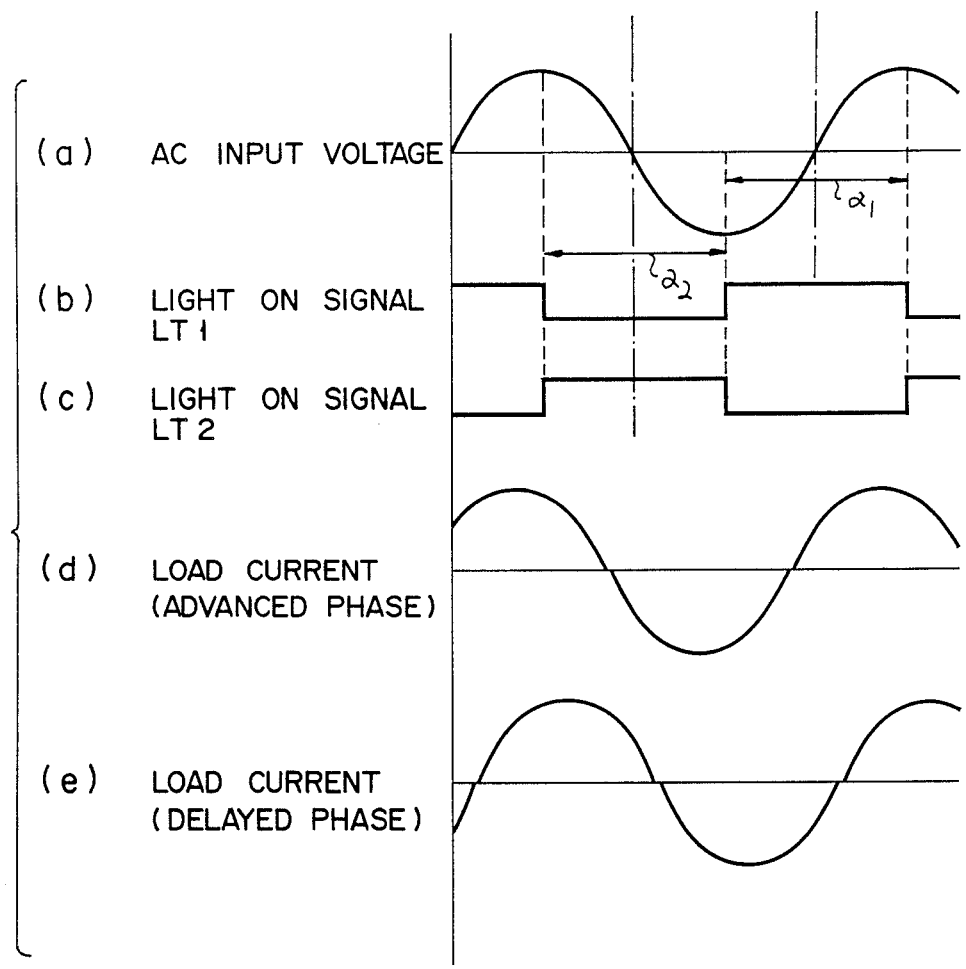
F I G. 4

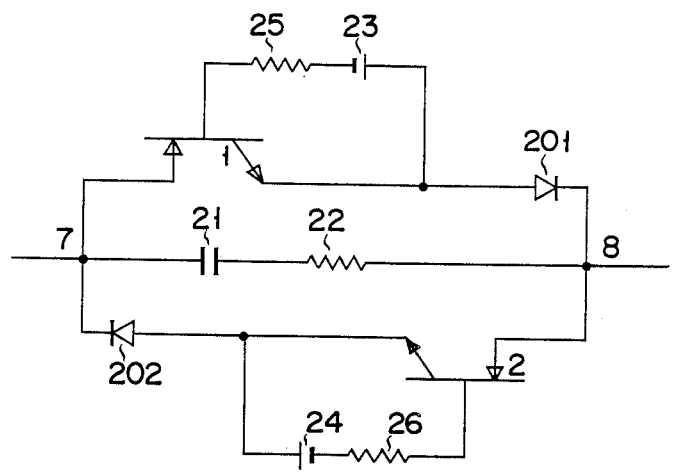
F I G. 8
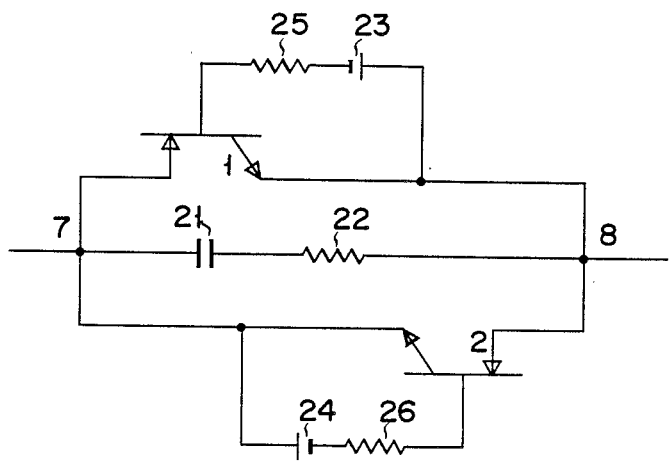
F I G. 9

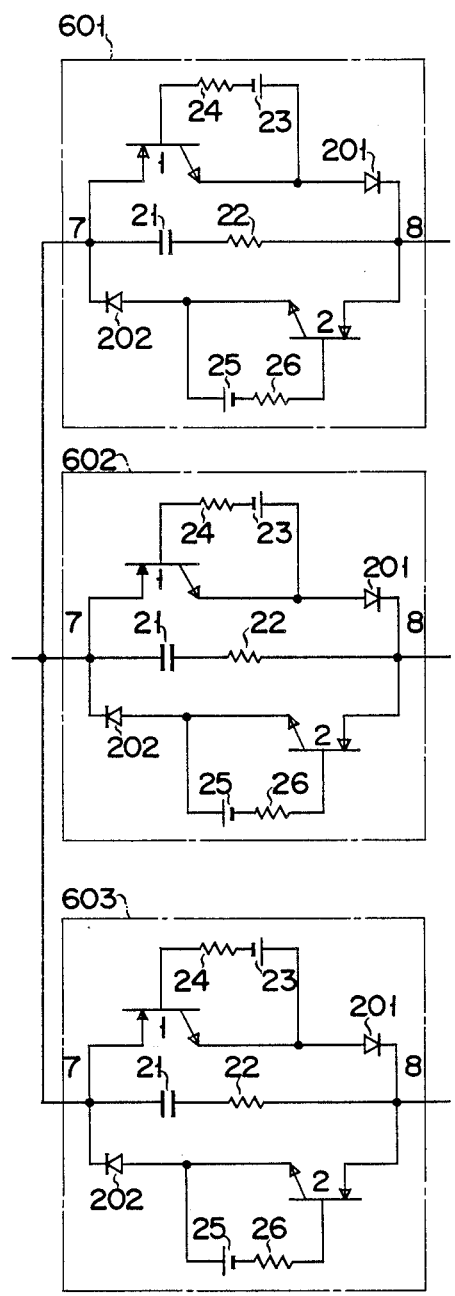 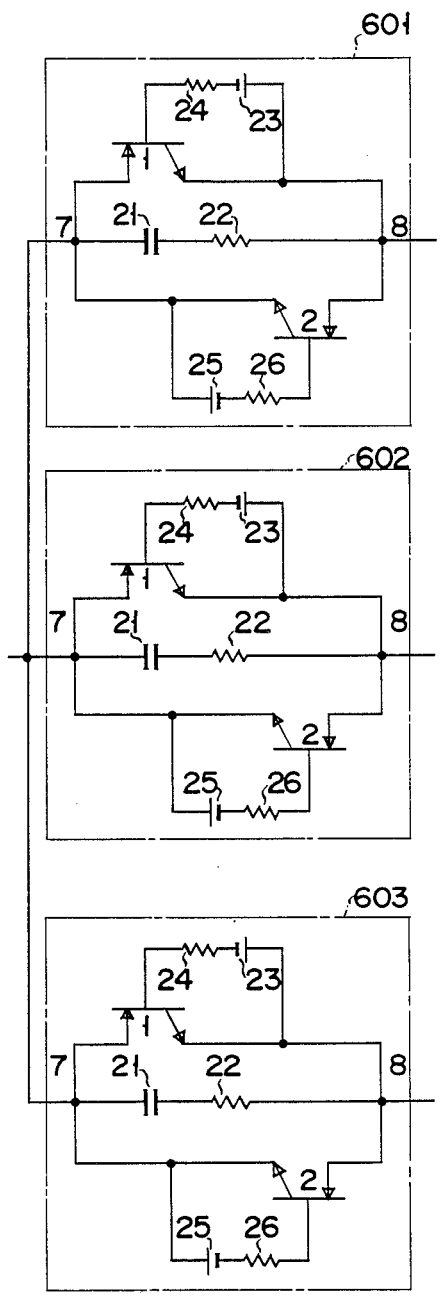
F I G. 10      F I G. 11 a: VOLTAGE BETWEEN SI THYRISTOR AC SWITCH TERMINALS
b: CURRENT BETWEEN SI THYRISTOR AC SWITCH TERMINALS
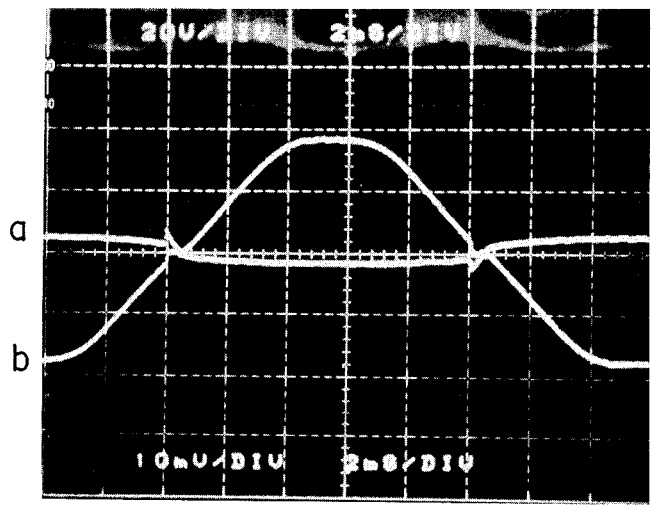
F I G. 12
a: VOLTAGE BETWEEN SI THYRISTOR AC SWITCH TERMINALS
   20V/DIV
b: CURRENT BETWEEN SI THYRISTOR AC SWITCH TERMINALS
   2A/DIV
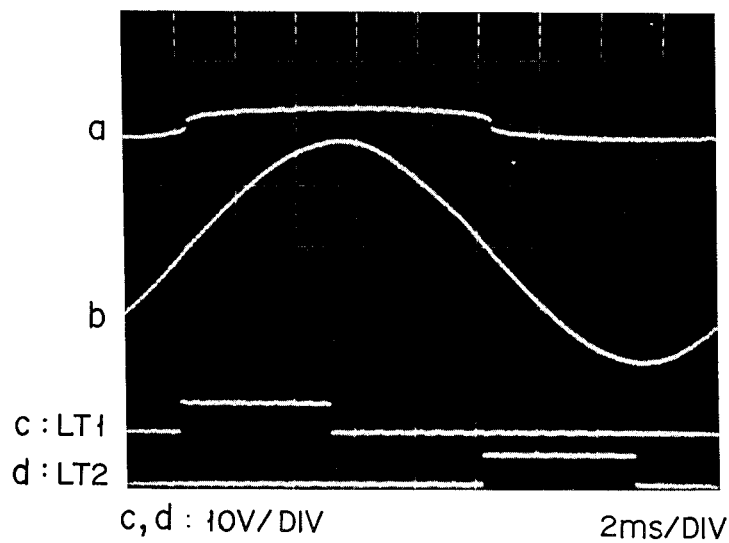
c, d : 10V/DIV  2ms/DIV
F I G. 13 a: VOLTAGE BETWEEN SI THYRISTOR AC SWITCH TERMINALS
20V/DIV
b: CURRENT BETWEEN SI THYRISTOR AC SWITCH TERMINALS
2A/DIV c,d: 10V/DIV     2ms/DIV a: OUTPUT VOLTAGE    b: LOAD CURRENT
50V/DIV               0.5A/DIV

2ms/DIV a: OUTPUT VOLTAGE    b: LOAD CURRENT
   50V/DIV              0.5A/DIV
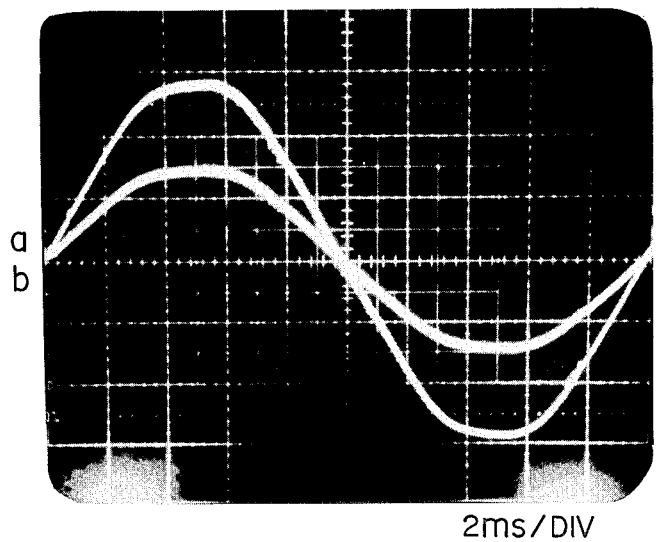
2ms/DIV
F I G. 16
a: OUTPUT VOLTAGE    b: LOAD CURRENT
   50V/DIV              0.5A/DIV
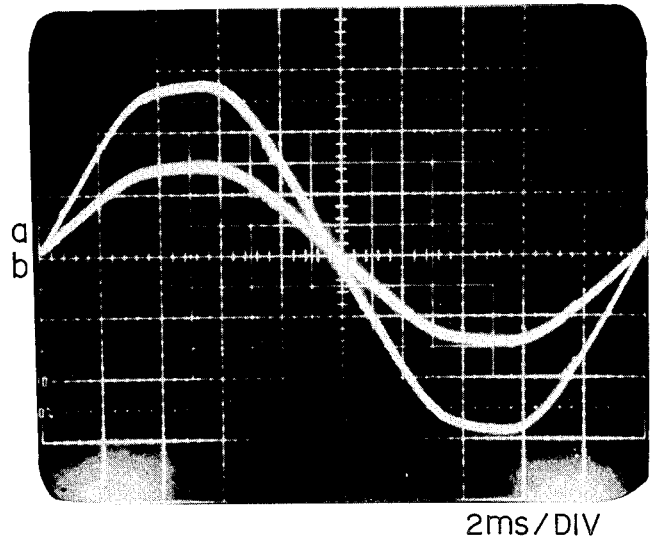
2ms/DIV
F I G. 17

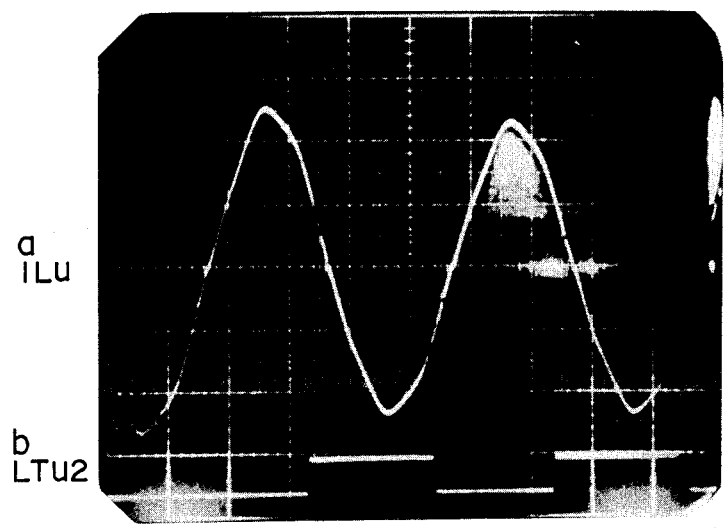
F I G. 18
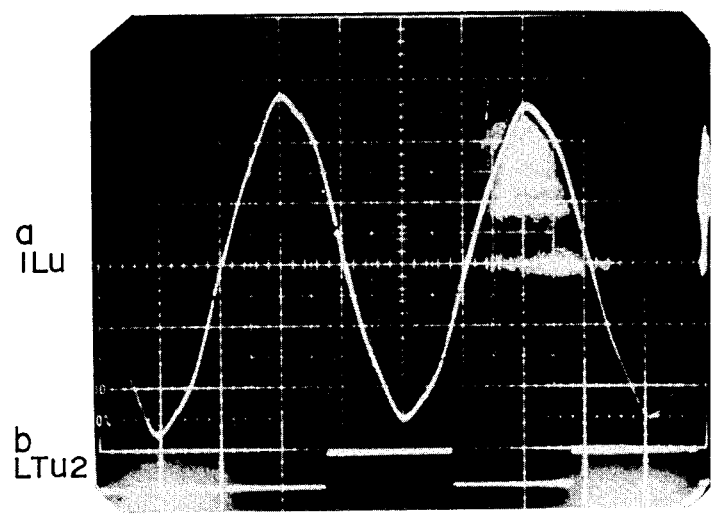
F I G. 19

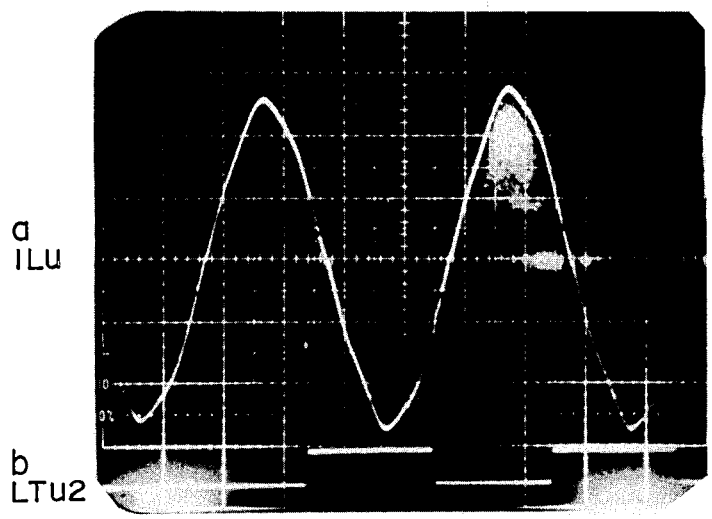
F I G. 20
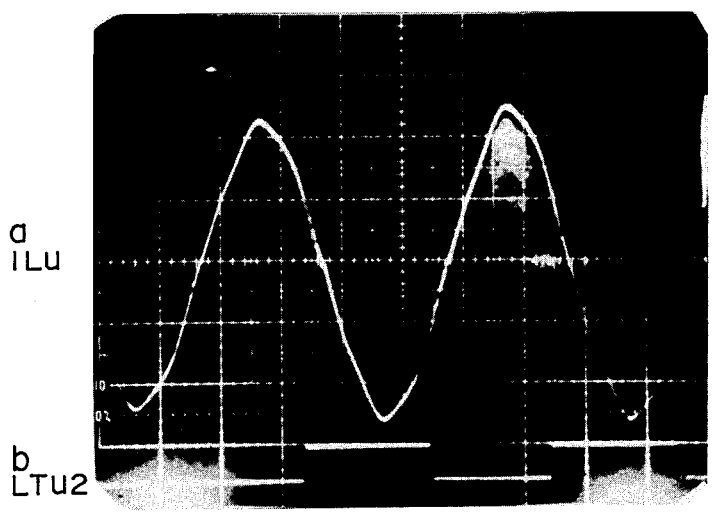
F I G. 21

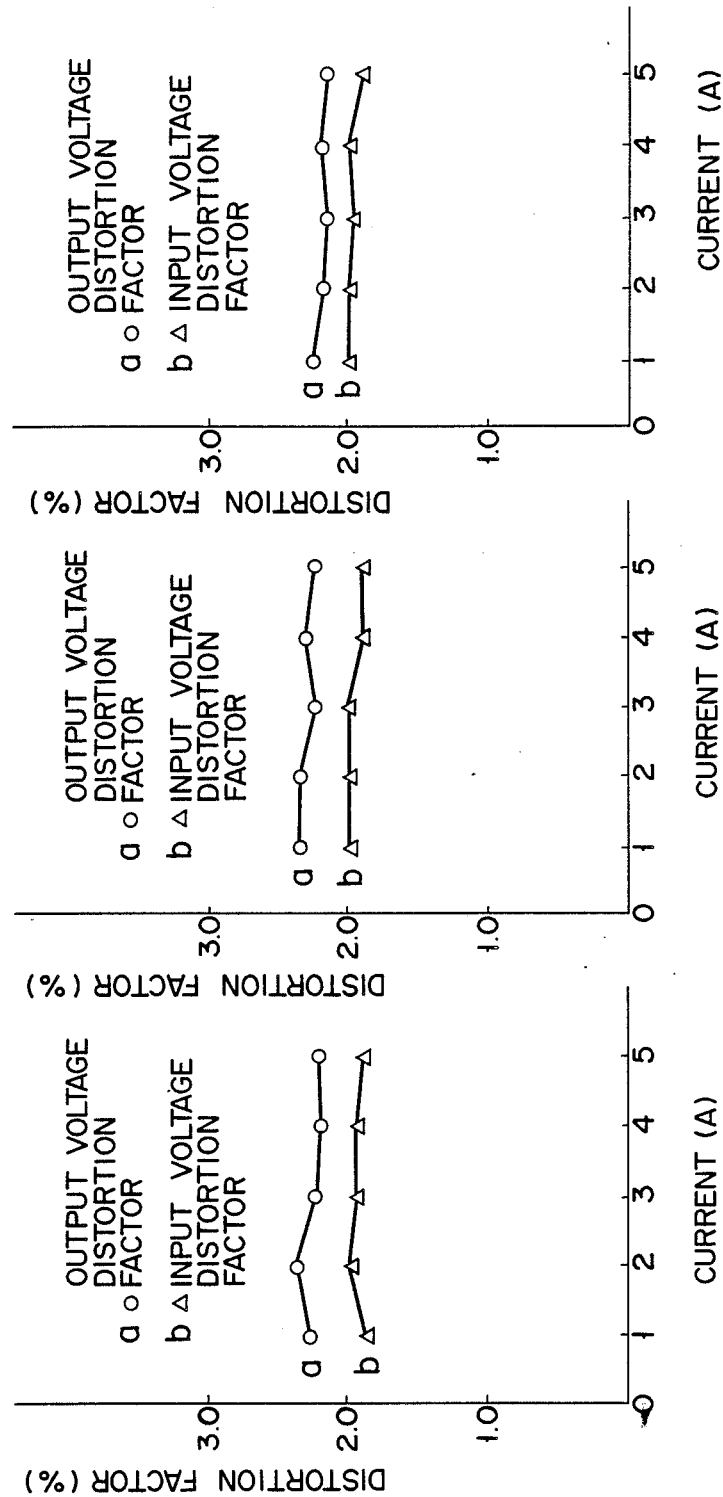

DISTORTION FACTOR k [%]

| TAP | LINES | CONDITION / DISTORTION FACTOR | 100V 1A U1 | 100V 1A U2 | 100V 1A U3 | 100V 2A U1 | 100V 2A U2 | 100V 2A U3 |
|---|---|---|---|---|---|---|---|---|
| W1 | U-V | kin | 2.00 | 2.12 | 2.25 | 2.20 | 2.19 | 2.25 |
| | | kout | 1.85 | 1.95 | 1.98 | 2.00 | 1.95 | 2.04 |
| | V-W | kin | 1.40 | 1.53 | 1.55 | 1.58 | 1.52 | 1.62 |
| | | kout | 1.65 | 1.72 | 1.80 | 1.86 | 1.82 | 1.82 |
| | W-U | kin | 1.95 | 1.95 | 2.00 | 2.20 | 2.23 | 2.23 |
| | | kout | 1.75 | 1.67 | 1.70 | 2.05 | 1.92 | 2.01 |
| W2 | U-V | kin | 2.13 | 2.12 | 2.22 | 2.16 | 2.13 | 2.20 |
| | | kout | 1.88 | 1.90 | 2.00 | 1.95 | 1.95 | 1.98 |
| | V-W | kin | 1.58 | 1.61 | 1.65 | 1.71 | 1.60 | 1.61 |
| | | kout | 1.78 | 1.75 | 1.72 | 1.83 | 1.72 | 1.81 |
| | W-U | kin | 1.92 | 2.00 | 2.05 | 2.13 | 2.20 | 2.14 |
| | | kout | 1.76 | 1.80 | 1.70 | 1.92 | 2.00 | 1.82 |
| W3 | U-V | kin | 2.15 | 2.13 | 2.20 | 2.24 | 2.29 | 2.28 |
| | | kout | 1.95 | 1.95 | 1.93 | 2.05 | 2.07 | 2.00 |
| | V-W | kin | 1.65 | 1.50 | 1.53 | 1.63 | 1.61 | 1.54 |
| | | kout | 1.75 | 1.60 | 1.62 | 1.78 | 1.75 | 1.70 |
| | W-U | kin | 1.92 | 1.95 | 2.05 | 2.00 | 2.00 | 2.00 |
| | | kout | 1.78 | 1.78 | 1.83 | 1.85 | 1.85 | 1.80 |

FIG. 29 kin : INPUT TERMINAL VOLTAGE DISTORTION FACTOR
kout : OUTPUT TERMINAL VOLTAGE DISTORTION FACTOR

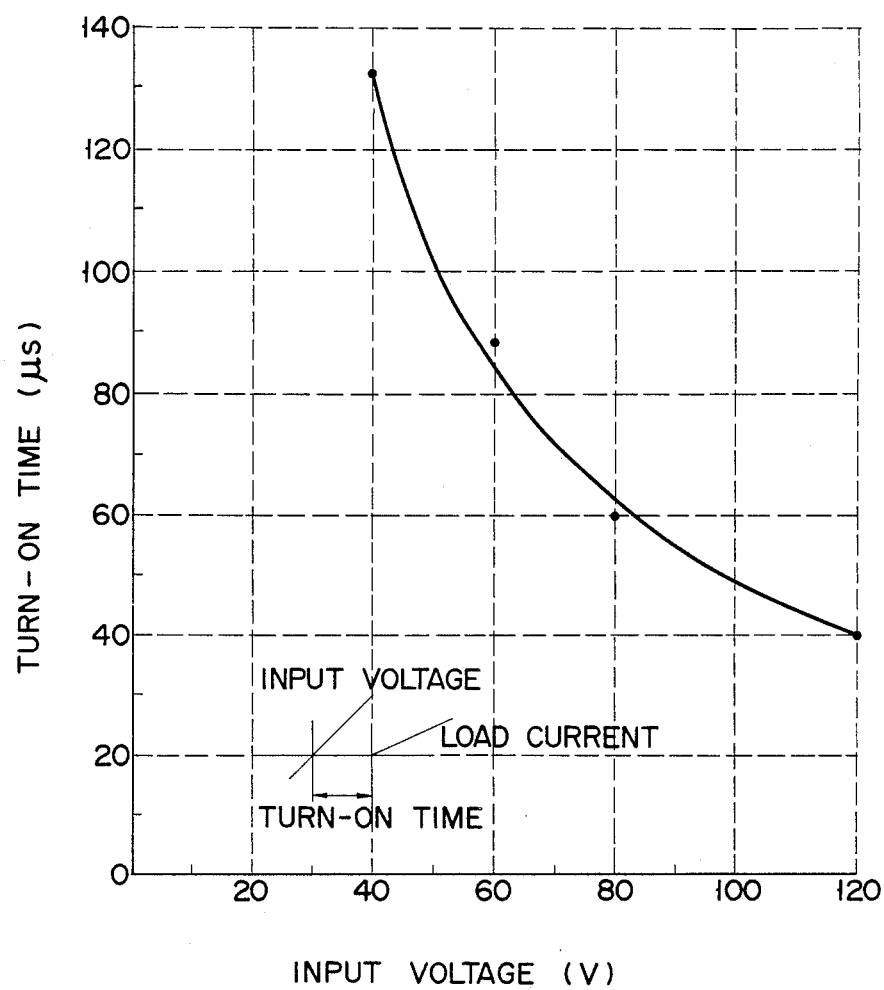
F I G. 30

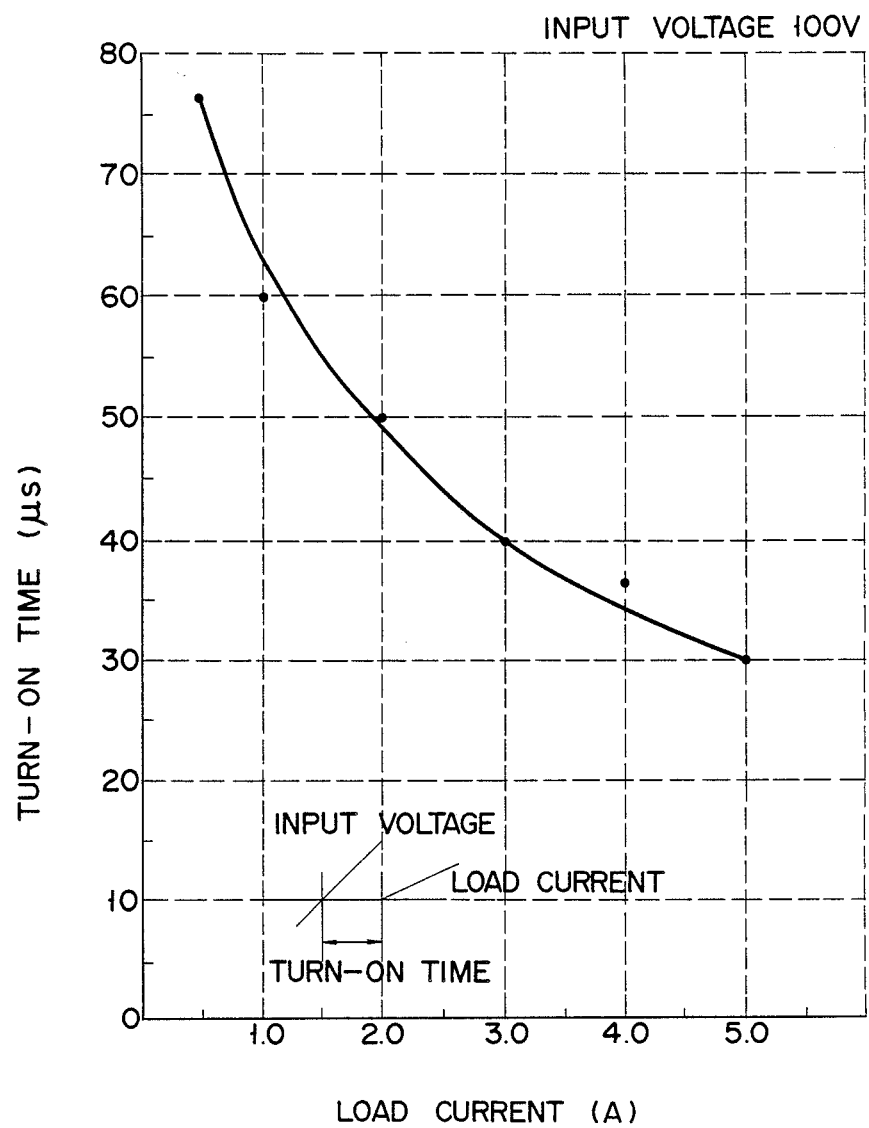
F I G. 31

POWER CONTROL APPARATUS

BACKGROUND OF THE INVENTION

1. Field of the Invention

The present invention is directed to an apparatus serving as a control system of a switching control apparatus for an AC circuit, and relates to a voltage control apparatus for controlling power on a power-transmission/distribution line of a power system and power to be supplied to a power-demanding destination. More particularly, this invention relates to a power control apparatus for a power system, such as a power line, which employs a light trigger control system of an AC control circuit using a static induction (SI) thyristor.

2. Description of the Related Art

Conventionally, a triac or a circuit which has thyristors (SCR) or gate turn off thyristors (GTO) coupled in parallel in the opposite bias directions, mainly serves as a power semiconductor device for controlling an AC circuit. There are two typical control systems for an AC circuit using power semiconductor devices. The first system applies an electric trigger signal with a short pulse width simultaneously on two power semiconductor devices coupled in parallel in the opposite bias directions, irrespective of the polarity of a voltage. The second one applies a trigger signal to these devices in accordance with the current phase.

With the use of power semiconductor devices, such as SCR's or GTO's, due to the characteristic of the devices themselves, the switching speed is slow and the ON voltage is high, thus increasing the power loss. Further, the excessive amount of the breakdown voltage with respect to a thermal damage or a sharp increase in voltage, caused by the phenomenon in which a current concentrates within the devices after power has been thrown ON, is smaller as compared with the case involving SI thyristors. Even though the devices are not actually damaged, therefore, the power loss is a bottle neck.

Due to the necessity to perform ON/OFF control of the devices, the gate circuit for SCR's or GTO's is not electrically insulated from the main power circuit, thus raising a problem of a malfunction caused by an electric noise, such as induction noise. Since a pulse transformer or the like is used for ON control according to the prior art, a gate driver inevitably becomes large.

With regard to OFF control, with SCR's in use, natural commutation turn off is applied which turns off the devices when the polarity of an AC current is inverted, while with GTO's in use, a large gate current is required for turning off the devices and the amount of turn-off charges is great, so that the size of the gate circuit becomes large.

In addition, in executing the ON control, it is necessary to match the triggering point with the phase of a current depending on the current phase, so that even in the commutation turn-off system, a current-phase detecting function should be added. Moreover, with a trigger signal having a short pulse width in use, if the triggering point does not coincide with the current phase, the proper ON control may be impossible, nor is the smooth ON control possible. Naturally, the triggering point should precisely coincide with the current phase, thus inevitably making the power controlling apparatus large and complicated.

SUMMARY OF THE INVENTION

Accordingly, it is an object of this invention to provide a power controlling apparatus in which SI thyristors having characteristics such as a high-speed function, a low power loss and being unlikely to be damaged by heat at the time of a switching operation due to a high dv/dt resistivity and a high di/dt resistivity, are coupled in the opposite bias directions, and an ON signal serving as a light signal from a light-emitting diode or the like is transmitted through a light transmission medium to thereby electrically insulate a main power circuit from a gate circuit, thus preventing a malfunction originating from electric noise such as induction noise.

It is another object of this invention to provide a compact and simple power controlling apparatus which ensures a current control irrespective of the phase of a current without adding any current-phase detecting function, by triggering a light ON signal with a relatively long pulse within a phase angle of less than 90° around the zero-cross point of an input voltage.

It is a further object of this invention to provide a power controlling apparatus which can execute an OFF control by using an OFF signal of SI thyristors and has a smaller amount of power consumed at the time of the OFF control as compared with the OFF control of GTO's, etc. There are three modes for OFF control: a commutation turn-off mode for an AC current of a low frequency below several kHz, a light-initiated turn-off mode of a relatively high frequency of above several kHz to several tens of kHz and an electric-signal-initiated turn-off mode.

According to one aspect of this invention, there is provided a power control apparatus which comprises:
a system for performing ON control of a pair of static induction thyristors, coupled in parallel in opposite bias directions, by transmitting a light signal with a relative long pulse width through a light transmission medium within a phase angle of less than or equal to 90° around a zero-cross point of an AC voltage, and performing OFF control by means of a natural commutation or by means of a light signal or an electric signal.

BRIEF DESCRIPTION OF THE DRAWINGS

FIG. 4 is a diagram illustrating waveforms of individual sections in the second embodiment;

FIGS. 8 and 9 are detailed circuit diagrams of the third and fourth embodiments;

FIGS. 10 and 11 are detailed circuit diagrams of the fifth embodiment;

FIG. 12 is a photograph of oscilloscopic waveforms of individual sections in the first embodiment;

FIGS. 13 and 14 are photographs of oscilloscopic waveforms of individual sections in the second embodiment;

FIGS. 15 through 17 are photographs of oscilloscopic waveforms of individual sections in the third embodiment;

FIGS. 18 through 25 are photographs of oscilloscopic waveforms of individual sections in the fourth embodiment;

FIGS. 26 through 28 are characteristic diagrams illustrating distortion factor data of individual sections in the third embodiment;

FIG. 29 is a diagram illustrating distortion factor data of individual sections in the fourth embodiment; and FIGS. 30 and 31 are characteristic diagrams illustrating data of turn-on times in the first embodiment.

DETAILED DESCRIPTION OF THE PREFERRED EMBODIMENTS

Embodiments of this invention will now be described referring to the accompanying drawings.

Figure 1:
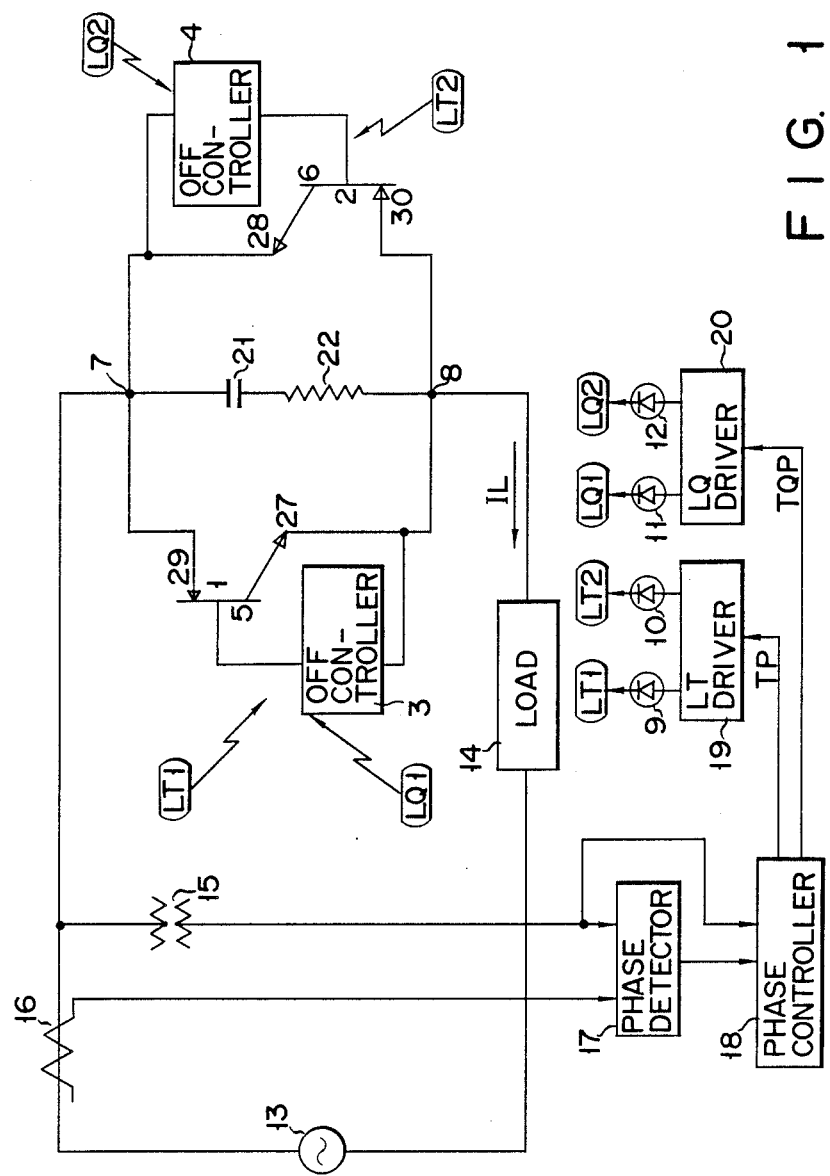
FIG. 1 is a block diagram illustrating the first embodiment of this invention.
Figure 2:
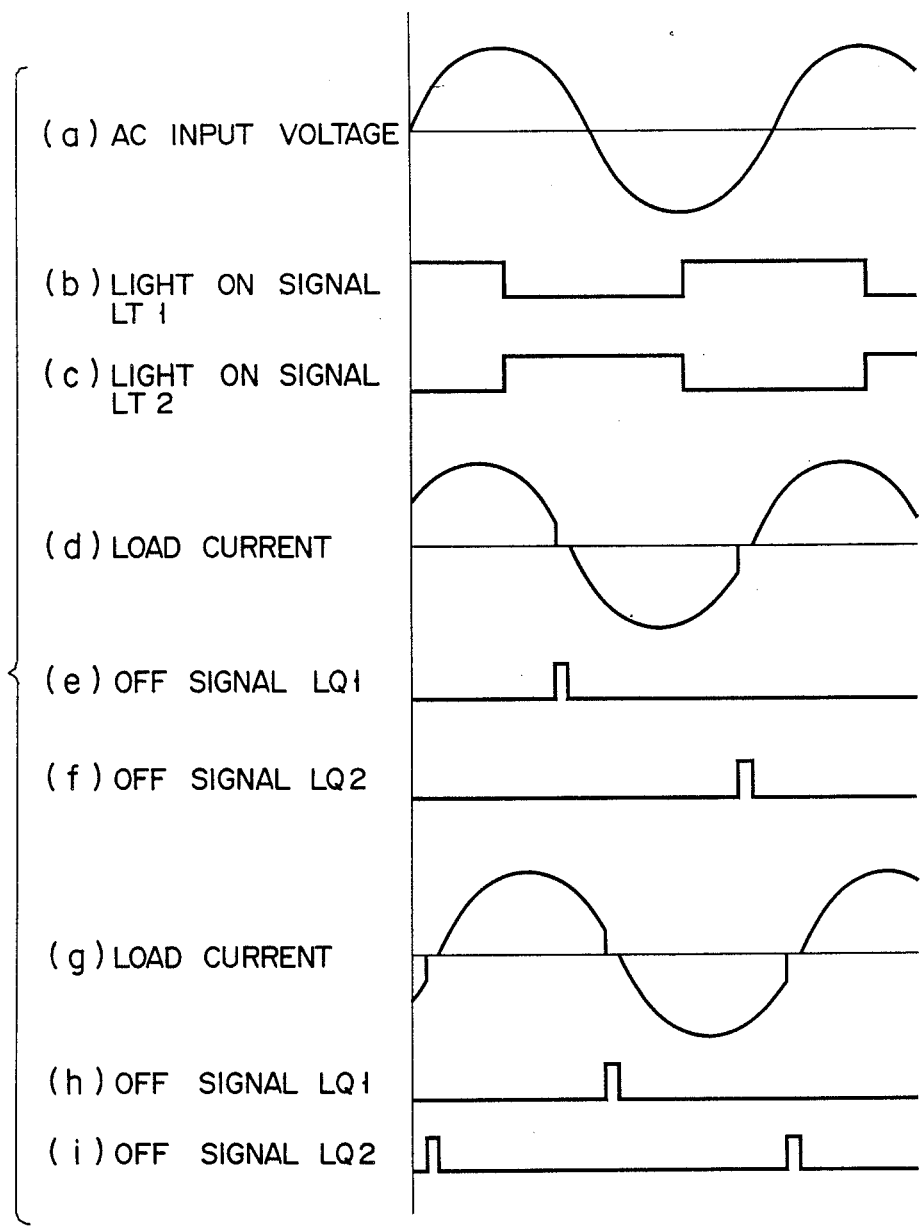
FIG. 2 is a diagram illustrating waveforms of individual sections in the first embodiment.

FIG. 1 illustrates the first embodiment and FIG. 2 is a time chart for waveforms of the individual sections in this embodiment. A SI thyristor 1 (hereinafter referred to as SIThy 1) through which a positive half-wave AC current passes and a SI thyristor 2 (hereinafter referred to as SIThy 2) through which a negative half-wave AC current passes, are coupled in parallel in the opposite bias directions to constitute a SI thyristor AC switch (see FIG. 1). Light ON signals LT1 and LT2 to turn on light-emitting diodes 9 and 10 are supplied from a light trigger (LT) driver 19 to the SIThy's I and 2 through a light transmission medium such as an optical fiber, for control of the flow of an AC current. As shown in FIG. 2, the light ON signals LT1 and LT2 from the LT driver 19 (FIG. 1) with a relatively long pulse width are respectively supplied to the first SIThy 1 and second SIThy 2 at the time a phase controller 18 detects the output timing of the light ON signals by means of a voltage signal from a PT 15.

With regard to OFF control, when the polarities of currents flowing through the SIThy's 1 and 2 (FIG. 1) invert, the commutation turn-off is effected. With a system for effecting OFF control by means of light or an electric signal, however, an OFF control circuit 3 is coupled between a gate electrode 5 and a cathode electrode 27 of SIThy 1 and an OFF control circuit 4 is coupled between a gate electrode 6 and a cathode electrode 28 of SIThy 2, and light or electric OFF signals LQ1 and LQ2 from a light quench (LQ) driver 20 are supplied to the OFF controllers 3 and 4, as shown in FIGS. 2(e) and 2(f) or FIGS. 2(h) and 2(i), thereby forcibly executing the turn-off control. The OFF signals LQ1 and LQ2 shown in FIGS. 2(e) and 2(f) and 2(h) and 2(i) are output in synchronism with a quench timing pulse TQP, which is output to the LQ driver 20 from the phase controller 18 in accordance with the phase of a current when a phase detector 17 detects the phase difference between a voltage and the current from a voltage signal and a current signal supplied from PT 15 and a CT 16 (both shown in FIG. 1). These OFF signals LQ1 and LQ2 can therefore correspond to a change in phase of the current.

Through the above ON/OFF control, a load current IL will have waveforms as shown in FIGS. 2(d) and 2(g) and the voltage and current between SI thyristor AC switch terminals 7 and 8 will have waveforms as shown in FIGS. 12(a) and 12(b). (The voltage waveform is inverted.)

The above OFF control system is a constituting element of the OFF controllers 3 and 4, and is triggered by light or an electric signal. With an electric-signal-initiated active element in use, the OFF signal is an electric signal, while with a light-sensitive element such as a static induction light transistor in use, the light signals LQ1 and LQ2 from light-emitting diodes 11 and 12 become the OFF signals.

Figure 3:
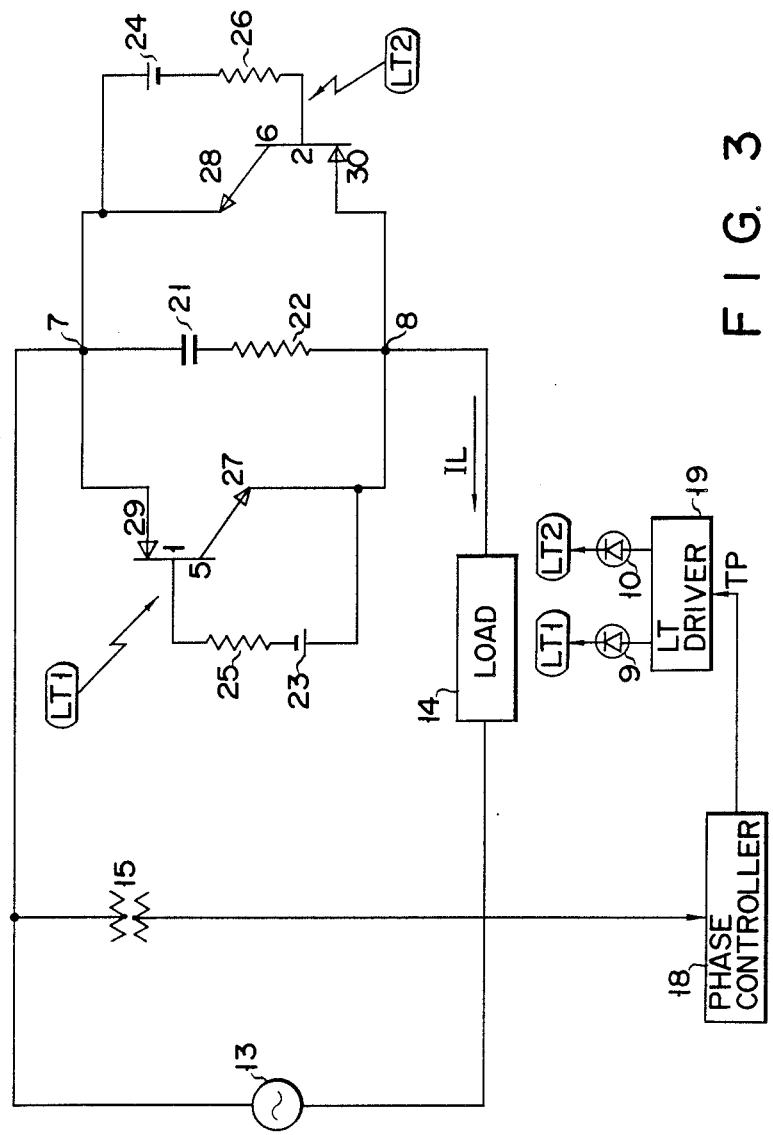
FIG. 3 is a block diagram illustrating the second embodiment of this invention.

FIG. 3 illustrates the second embodiment, and FIG. 4 is a time chart of waveforms of the individual sections in the second embodiment. The same reference numerals as used for the first embodiment shown in FIG. 1 are also used in FIG. 3 to specify corresponding or identical sections, thus omitting a detailed description thereof.

FIG. 3 illustrates the structure employing the commutation turn-off system. The light ON signals LT1 and LT2 with a relatively long pulse width supplied from the LT driver 19 to the SIThy's 1 and 2 alternately, as shown in FIGS. 4(b) and 4(c), within an ignition phase angle of 180°. The term "ignition phase angle" is used herein to mean an electrical phase angle $\alpha_1$ and $\alpha_2$. FIG. 4 of an ignition light pulse overlapping the zero-cross point, an instant at which the source voltage passes through zero. In this case, the ignition light pulse precedes the AC input voltage of the phase angle of 90° before the zero-cross point synchronized with the output of an AC power source 13. Accordingly, the flow of the AC current can be controlled in accordance with a change in current phase as shown in FIGS. 4(d) and 4(e), which is originated from the type of the load 14. According to the above embodiment, the timing for outputting the light ON signals LT1 and LT2 from the light-emitting diodes 9 and 10 is set by the phase controller 18 in such a way that the signals LT1 and LT2 are output 2 ms earlier than the zero-cross point of the voltage signal synchronized with the output of the AC power source 13, and the duration time of the signals LT1 and LT2 is set to 5 ms by the LT driver 19. The voltage and current between the SI thyristor AC switch terminals 7 and 8 and the light ON signals LT1 and LT2 have waveforms as shown in FIGS. 13 and 14.

Figure 14:
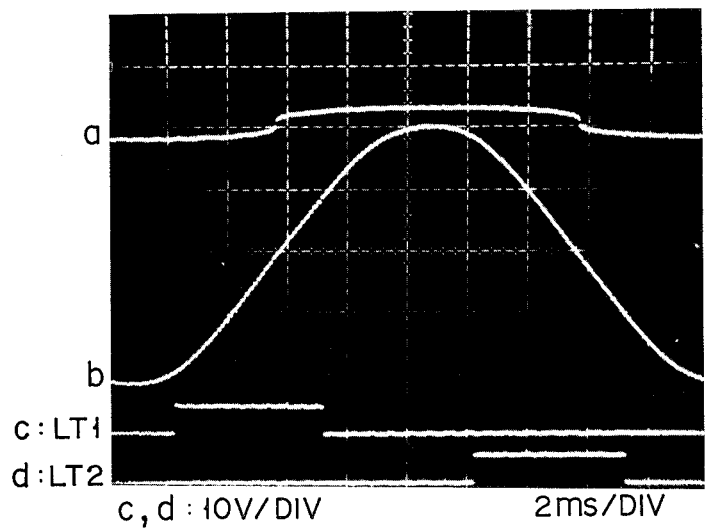

FIG. 13 illustrates a current with advanced phase, and FIG. 14 illustrates a current with delayed phase.

Figure 5:
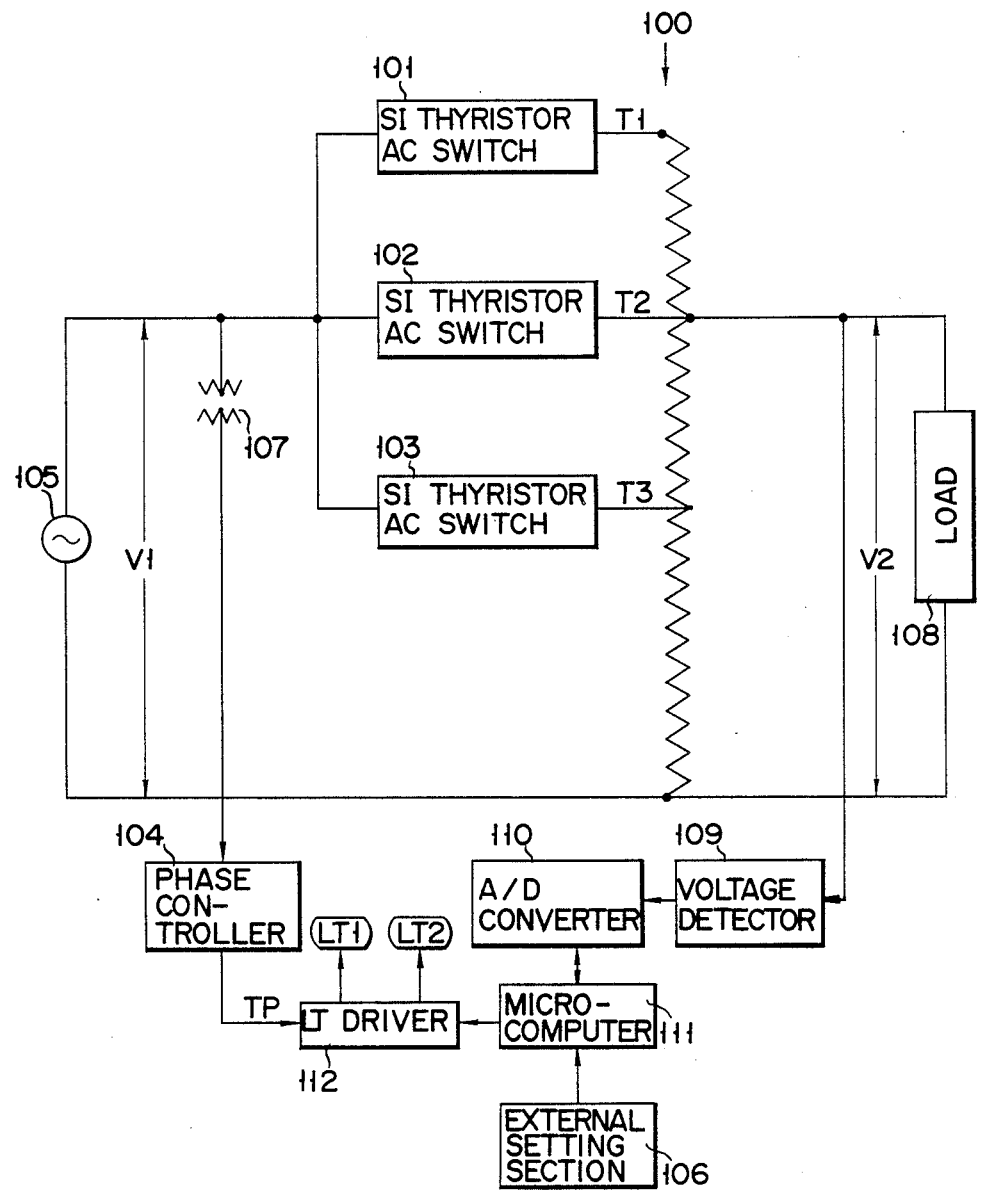
FIG. 5 is a block diagram illustrating the third embodiment of this invention.

FIG. 5 illustrates the third embodiment, and FIGS. 8 and 9 give examples of detailed circuit diagrams of SI thyristor AC switches 101, 102 and 103. The same reference numerals as used for the second embodiment shown in FIG. 3 are also used in FIG. 5 to specify corresponding or identical sections, thus omitting a detailed description thereof. FIG. 8 illustrates the circuit with the backward breakdown voltage of the SIThy's 1 and 2 being small; diodes 201 and 202 are coupled as illustrated to protect the circuit from the backward voltage. FIG. 9 illustrates the circuit with the backward breakdown voltage of the SIThy's being large.

A single-winding transformer 100 shown in FIG. 5 is designed to have the first stage tap T1, second stage tap T2 and third stage tap T3 on the input side. Given that $n_1$, $n_2$ and $n_3$ are the numbers of windings corresponding to these taps T1, T2 and T3, they have the relationship of $n_1 > n_2 > n_3$, and the number of winding on the output side is n.

The operation sequence for the third embodiment is controlled in accordance with a program stored in a microcomputer 111. When the program starts, the microcomputer 111 sends a control signal to the SI thyristor AC switch 102 coupled to the second stage tap T2 of the single-winding transformer 100.

This control signal permits the light ON signals LT1 and LT2 from the LT driver 112 (see FIG. 5) to be supplied through a light transmission medium such as an optical fiber to the SIThy's 1 and 2 (see FIGS. 8 and 9) of the SI thyristor AC switch 102 coupled to the single-winding transformer 100, in synchronism with a Trigger Pulse (TP) signal from a phase controller 104. A positive half-wave AC current flows through the SIThy 1 and a negative half-wave AC current flows through the SIThy 2 so that an AC current flows through the winding of the single-winding transformer 100 shown in FIG. 5 and appears on the output side thereof due to the mutual induction. The ratio of the input voltage to the voltage generated on the output side of the single-winding transformer 100 by this mutual induction is proportional to the winding ratio. Given that V1 is the voltage of an AC input power source 105 and V2 is the voltage on the output side, therefore, $$\frac{V_1}{V_2} = \frac{n_1}{n}$$

The microcomputer 111 then sends to an A/D converter 110 a command for A/D conversion of the output voltage V2 from the single-winding transformer 100.

The A/D converter 110 converts the output voltage V2, which has been converted into a DC voltage through a voltage detector 109, into a digital value and then sends the digital data to the microcomputer 111.

The microcomputer 111 compares the received digital data with a value set by the program or an external setting section 106. This operation is periodically repeated. When the digital data from the A/D converter 110 continuously deviates from the set value during the operation for a time period set by the program or the external setting section 106, the microcomputer 111 sends to the LT driver 112 a signal to switch the control to the SI thyristor AC switch 101 or 103 coupled to the first stage tap T1 or third stage tap T3 of the single-winding transformer 100. A description will be given below of a detailed operation of this embodiment in the case where the set value is 95 V to 105 V and the set time is 5 sec.

Assume that the AC current is controlled by the SI thyristor AC switch 101 or 102 coupled to the tap T1 or T2 of the single-winding transformer 100 shown in FIG. 5 under the control of the control signal from the microcomputer 111. When a load current decreases due to a reduction in the load 108 or the like and the output voltage V2 of the transformer 100 increases accordingly, the microcomputer 111 interrupts the supply of the control signal and sends to the LT driver 112 a control signal for the SI thyristor AC switch 102 or 103 coupled to the tap T2 or T3 one stage higher than the present tap, if the output voltage V2 subjected to A/D conversion in the A/D converter 110 is discriminated by the microcomputer 111 to be greater than the set value (95 V to 105 V) and this event continues for the time (5 sec) set by the program or the external setting section 106.

The LT driver 112 is designed in such a way as to output the light ON signals, LT2 first, when the microcomputer 111 generates the control signal. After outputting the light ON signal LT1 is completed, the LT driver 112 having received the control signal sequentially sends the light ON signals, starting from the signal LT2, through a light transmission medium such as an optical fiber to the SIThy's 1 and 2 (see FIGS. 8 and 9) of the SI thyristor AC switch 102 or 103 coupled to the tap T2 or T3 one stage higher than the present tap, in synchronism with the TP from the phase controller 104 shown in FIG. 5. Accordingly, the actuation of the SI thyristor AC switches 102 and 103 is controlled and the tap switching of the single-winding transformer 100 is executed. Because of the tap switching, the ratio of the input voltage V1 to the output voltage 2 generated on the output side of the single-winding transformer 100 becomes $$\frac{V_1}{V_2} = \frac{n_2}{n} \text{ or } \frac{V_1}{V_2} = \frac{n_3}{n}.$$

It should be noted that the output voltage is $n_2/n_1$ or $n_3/n_2$ times greater than the one acquired prior to the tap switching, thus compensating for a change in output voltage caused by a reduction in the load 108 or the like. The voltage across the load 108 (FIG. 5) and the current passing through it would have the waveforms as shown in FIG. 16 when the tap is switched to T2 from T1, and would have the waveforms as shown in FIG. 17 when the tap is switched to T3 from T2.

In the case where the SI thyristor AC switch 103 coupled to the third stage tap T3 is controlled, the tap switching is not executed even if the output voltage is increased above the set value.

Assume that the AC current is controlled by the SI thyristor AC switch 102 or 103 coupled to the tap T2 or T3 of the single-winding transformer 100 shown in FIG. 5 under the control of the control signal from the microcomputer 111. When a load current increases due to an increase in the load or the like and the output voltage V2 of the transformer 100 decreases accordingly, the microcomputer 111 interrupts the supply of the control signal and sends to the LT driver 112 a control signal for the SI thyristor AC switch 101 or 102 coupled to the tap T1 or T2 one stage lower than the present tap, if the output voltage V2 subjected to A/D conversion in the A/D converter 110 is discriminated by the microcomputer 111 to be smaller than the set value (95 V to 105 V) and this event continues for the time (5 sec) set by the program or the external setting section 106.

After outputting the light ON signal LT1 is completed, the LT driver 112 having received the control signal sequentially sends the light ON signals, starting from the signal LT2, through a light transmission medium such as an optical fiber to the SIThy's 1 and 2 (see FIGS. 8 and 9) of the SI thyristor AC switch 101 or 102 coupled to the tap T1 or T2 one stage lower than the present tap, in synchronism with the TP from the phase controller 104 shown in FIG. 5. Accordingly, the actuation of the SI thyristor AC switches 101 and 102 is controlled and the tap switching of the single-winding transformer 100 is executed.

Because of the tap switching, the ratio of the input voltage $V_1$ to the output voltage 2 generated on the output side of the single-winding transformer 100 becomes $$\frac{V_1}{V_2} = \frac{n_1}{n} \text{ or } \frac{V_1}{V_2} = \frac{n_2}{n}.$$

Figure 15:
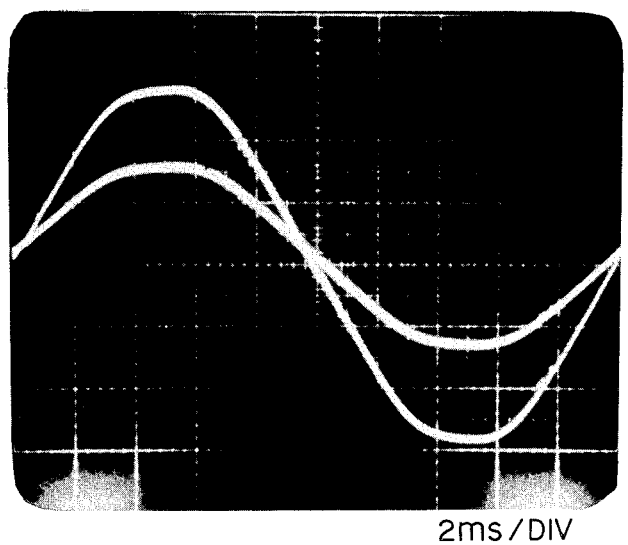

It should be noted that the output voltage is $n_1/n_2$ or $n_2/n_3$ times greater than the one acquired prior to the tap switching, thus compensating for a change in output voltage caused by an increase in the load 108 or the like. The voltage across the load 108 (FIG. 5) and the current passing through it would have the waveforms as shown in FIG. 15 when the tap is switched to T1 from T2.

In the case where the SI thyristor AC switch 101 coupled to the first stage tap T1 is controlled, the tap switching is not executed even if the output voltage falls below the set value.

Figure 6:
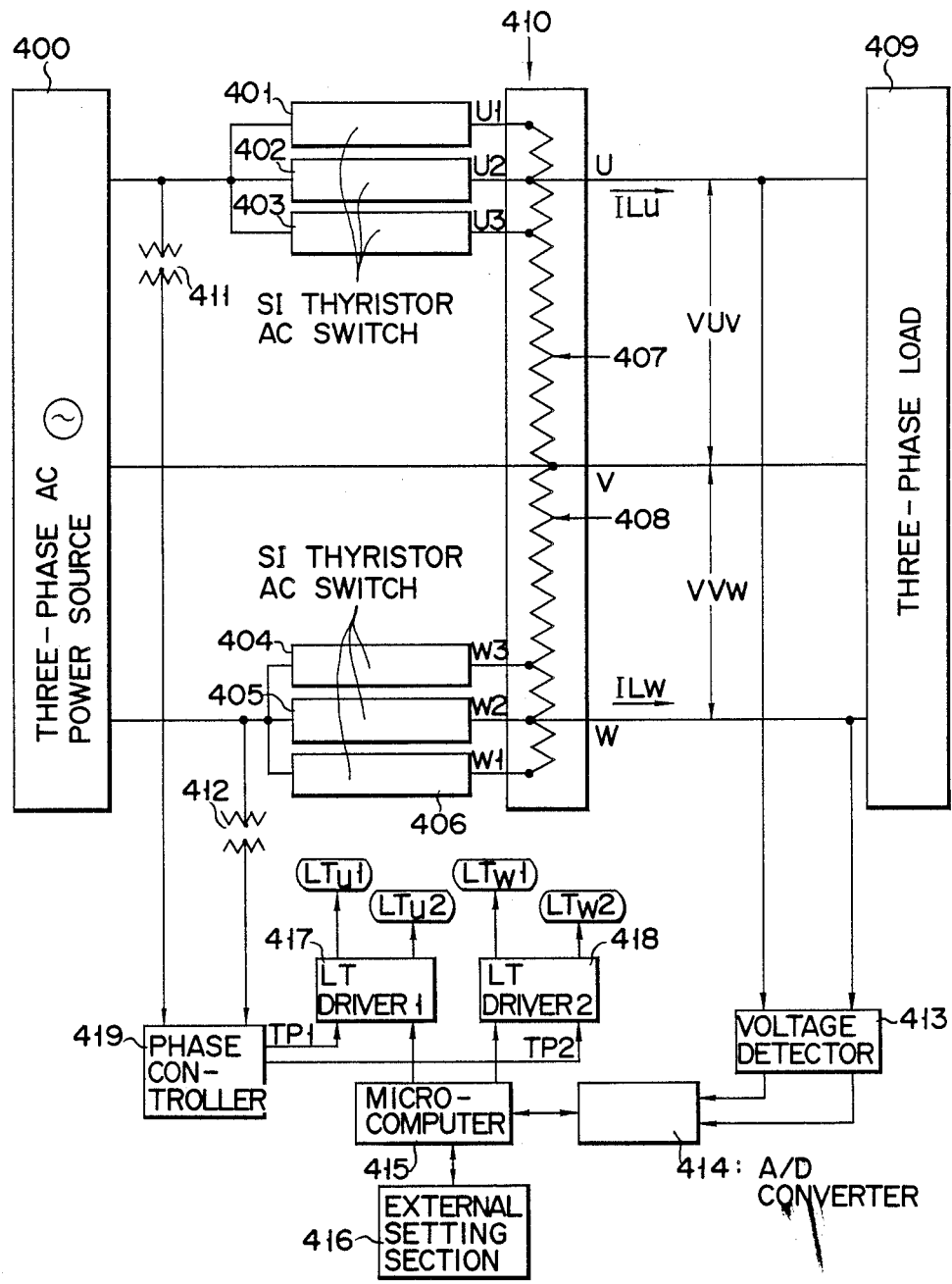
FIG. 6 is a block diagram illustrating the fourth embodiment of this invention.

FIG. 6 illustrates the fourth embodiment, and FIGS. 8 and 9 give examples of detailed circuit diagrams of SI thyristor AC switches 401 to 406. The same reference numerals as used for the second embodiment shown in FIG. 3 are also used in FIG. 6 to specify corresponding or identical sections, thus omitting a detailed description thereof. FIG. 8 illustrates the circuit with the backward breakdown voltage of the SIThy's 1 and 2 being small; diodes 201 and 202 are coupled as illustrated to protect the circuit from the backward voltage. FIG. 9 illustrates the circuit with the backward breakdown voltage of the SIThy's being large.

A single-winding transformer 407 between U and V of a single-winding V-coupled three-phase transformer 410 shown in FIG. 6 and a single-winding transformer 408 between V and W in FIG. 6 are designed to have the first stage tap $u_1$ and $w_1$, second stage tap $u_2$ and $w_2$ and third stage tap $u_3$ and $w_3$ on the input side. Given that $n_1$ is the number of winding of $u_1$ and $w_1$, $n_2$ is the number of winding of $u_2$ and $w_2$ and $n_3$ is the number of winding of $w_{30}$ they have the relationship of $n_1 > n_2 > n_3$, and the number of winding on the output side is n.

The embodiment of FIG. 6 is controlled in accordance with a program stored in a microcomputer 415. When the program starts, the microcomputer 415 sends to LT drivers 417 and 418 control signals for the SI thyristor AC switches 402 and 405 coupled to the second stage taps $u_2$ and $w_2$ of the single-winding V-coupled three-phase transformer 410.

The LT driver 417 sends light ON signals $LT_u1$ and $LT_u2$, and the LT driver 418 sends light ON signals $LT_w1$ and $LT_w2$, the SI thyristor AC switches 402 and 405 corresponding to the control signals, to control the flow of the AC current to thereby generate a voltage on the output side of the single-winding V-coupled three-phase transformer 410.

The microcomputer 415 then sends to an A/D converter 414 a command for A/D conversion of the output voltage $V_{uv}$ from the single-winding transformer 407 between U and W of the single-winding V-coupled three-phase transformer 410. The A/D converter 410 converts the output voltage $V_{uv}$, which has been converted into a DC voltage through a voltage detector 413, into a digital value and then sends the digital data to the microcomputer 415.

The microcomputer 415 compares the received digital data with a value set by the program or an external setting section 416. This operation is also executed for the output voltage $V_{vw}$ of the single-winding transformer 408 between V and W of the three-phase transformer 410. The above operation is periodically repeated. When the digital data from the A/D converter 414 continuously deviates from the set value during the operation for a time period set by the program or the external setting section 416, the corresponding tap switching of the three-phase transformer 410 is executed according to the program. The LT drivers 417 and 418 interrupt the generation of the light ON signals $LT_u1$, $LT_u2$ and $LT_w1$, $LT_w2$ in response to the control signals from the microcomputer 415, and then send the light ON signals $LT_u1$, $LT_u2$ and $LT_w1$, $LT_w2$ to the SI thyristor AC switches 401, 402, 403 and 404, 405, 406 associated with the control signals, in synchronism with a timing pulse TP1 from a phase controller 419 for the LT driver 412 and a timing pulse TP2 for the LT driver 418. Accordingly, the tap switching of the single-winding V-coupled three-phase transformer 410 is executed.

A description will be given below of the operation of this embodiment in the case where the voltage of the three-phase AC power source 400 of the three-phase transformer 410 is 100 V or the three-phase load 409 has a resistance of 100 Ω, the set value is 95 V to 105 V and the set time is 5 sec.

Assume that either the SI thyristor AC switches 401 and 402 or 404 and 405 coupled to the first stage taps $u_1$ and $w_1$ or the second stage taps $u_2$ and $w_2$ of the single-winding transformer 407 between U and W of the three-phase transformer 410 shown in FIG. 6 and the single-winding transformer between V and W thereof are controlled by the control signals from the microcomputer 415. When both or either of the output voltages $V_{uv}$ and $V_{vw}$ between U and V and V and W exceeds 105 V and such a state continues for 5 sec, the microcomputer 415 sends to the associated LT drivers 412 and 413 control signals to switch the SI thyristor AC switches to the switches 402 and 405 or 403 and 406 coupled to the taps $u_2$ and $w_2$ or $u_3$ and $w_3$ one stage higher than the present taps $u_1$ and $w_1$ or $u_2$ and $w_2$.

According to this embodiment, since the LT drivers 412 and 413 are designed to output the light ON signals in the sequence of $LT_u2$ and $LT_u1$ and in the sequence of $LT_w1$ and $LT_w2$, respectively, the tap switching of the single-winding transformers 407 and 408 between U and V or V and W can be executed by outputting these light ON signals to the SI thyristor AC switches 402, 403, 405 and 406 associated with the control signals from the microcomputer 415, in the mentioned sequences.

Since a change in the output voltage caused by the tap switching is the same as the one caused in the third embodiment, its detailed description will be omitted here.

In the case where the SI thyristor AC switches 403 and 406 coupled to the third stage taps $u_3$ and $w_3$ are controlled, the tap switching is not executed even if the output voltages $V_{uv}$ and $V_{vw}$ are increased above the set value.

Figure 22:
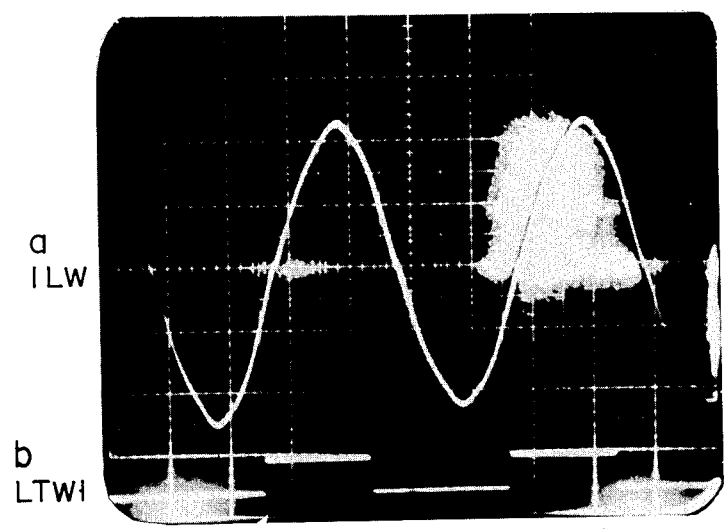
Figure 23:
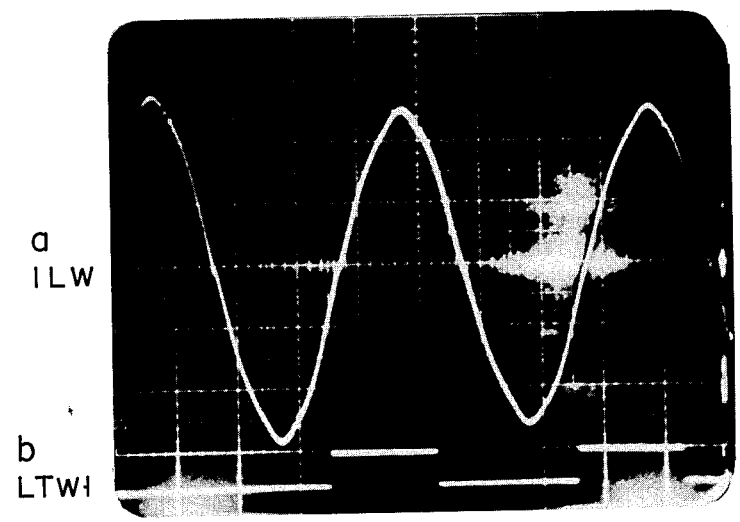

FIG. 18 illustrates the waveforms of the current $IL_u$ and light ON signal $LT_u2$ in the case where the tap of the single-winding transformer 407 between U and V is switched to $u_2$ from $u_1$, and FIG. 19 illustrates the same waveforms in the case where the tap is switched to $u_3$ from $u_2$. FIG. 22 illustrates the waveforms of the current $IL_w$ and light ON signal $LT_w1$ in the case where the tap of the single-winding transformer 408 between V and W is switched to $w_2$ from $w_1$, and FIG. 23 illustrates the same waveforms in the case where the tap is switched to $w_3$ from $w_2$.

Assume that either the SI thyristor AC switches 402 and 403 or 405 and 406 coupled to the second stage taps $u_2$ and $w_2$ or the third stage taps $u_3$ and $w_3$ are controlled by the control signals from the microcomputer 415. When both or either of the output voltages $V_{uv}$ and $V_{vw}$ between U and V and V and W falls below 95 V and such a state continues for 5 sec, the microcomputer 415 sends to the associated LT drivers 412 and 413 control signals to switch the SI thyristor AC switches to the switches 401 and 404 or 402 and 405 coupled to the taps $u_1$ and $w_1$ or $u_2$ and $w_2$ one stage lower than the present taps $u_2$ and $w_2$ or $u_3$ and $w_3$.

The tap switching can be executed by outputting the light ON signals $LT_u1$, $LT_u2$ and $LT_w1$, $LT_w2$ from the LT drivers 412 and 413 to the SI thyristor AC switches 401 to 404 associated with the control signals from the microcomputer 415, the tap switching can be executed by outputting these light ON signals to the SI thyristor AC switches 402, 403, 405 and 406 associated with the control signals from the microcomputer 415.

Since a change in the output voltage caused by the tap switching is the same as the one caused in the third embodiment, its detailed description will be omitted here.

In the case where the SI thyristor AC switches 401 and 404 coupled to the first stage taps $u_1$ and $w_1$ are controlled, the tap switching is not executed even if the output voltages $V_{uv}$ and $V_{vw}$ are decreased below the set value.

Figure 24:
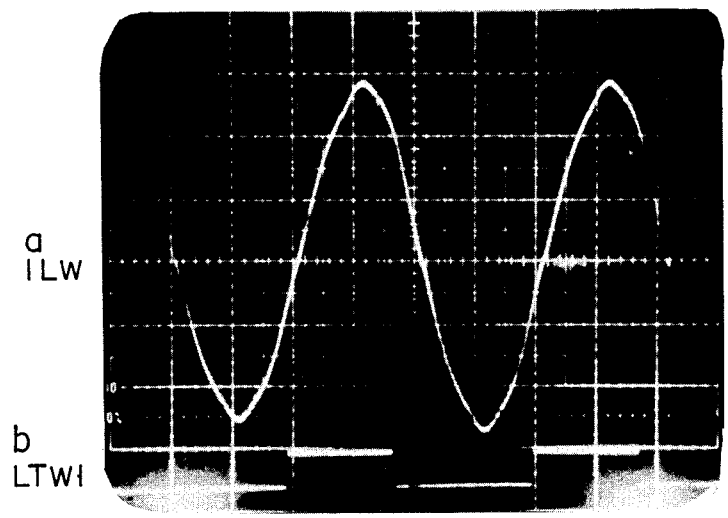
Figure 25:
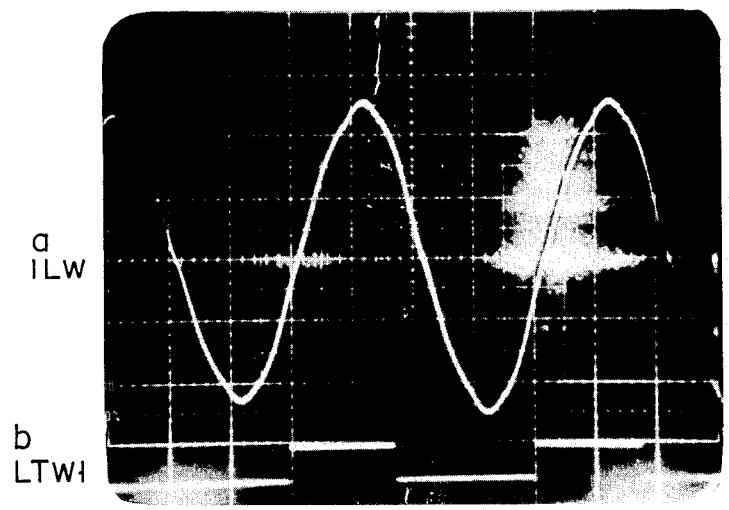

FIG. 20 illustrates the waveforms of the current $IL_u$ and light ON signal $LT_u2$ in the case where the tap is switched to $u_2$ from $u_3$, and FIG. 21 illustrates the same waveforms in the case where the tap is switched to $u_1$ from $u_2$. FIG. 24 illustrates the waveforms of the current $IL_w$ and light ON signal $LT_w1$ in the case where the tap is switched to $w_2$ from $w_3$, and FIG. 25 illustrates the same waveforms in the case where the tap is switched to $w_1$ from $w_2$.

Figure 7:
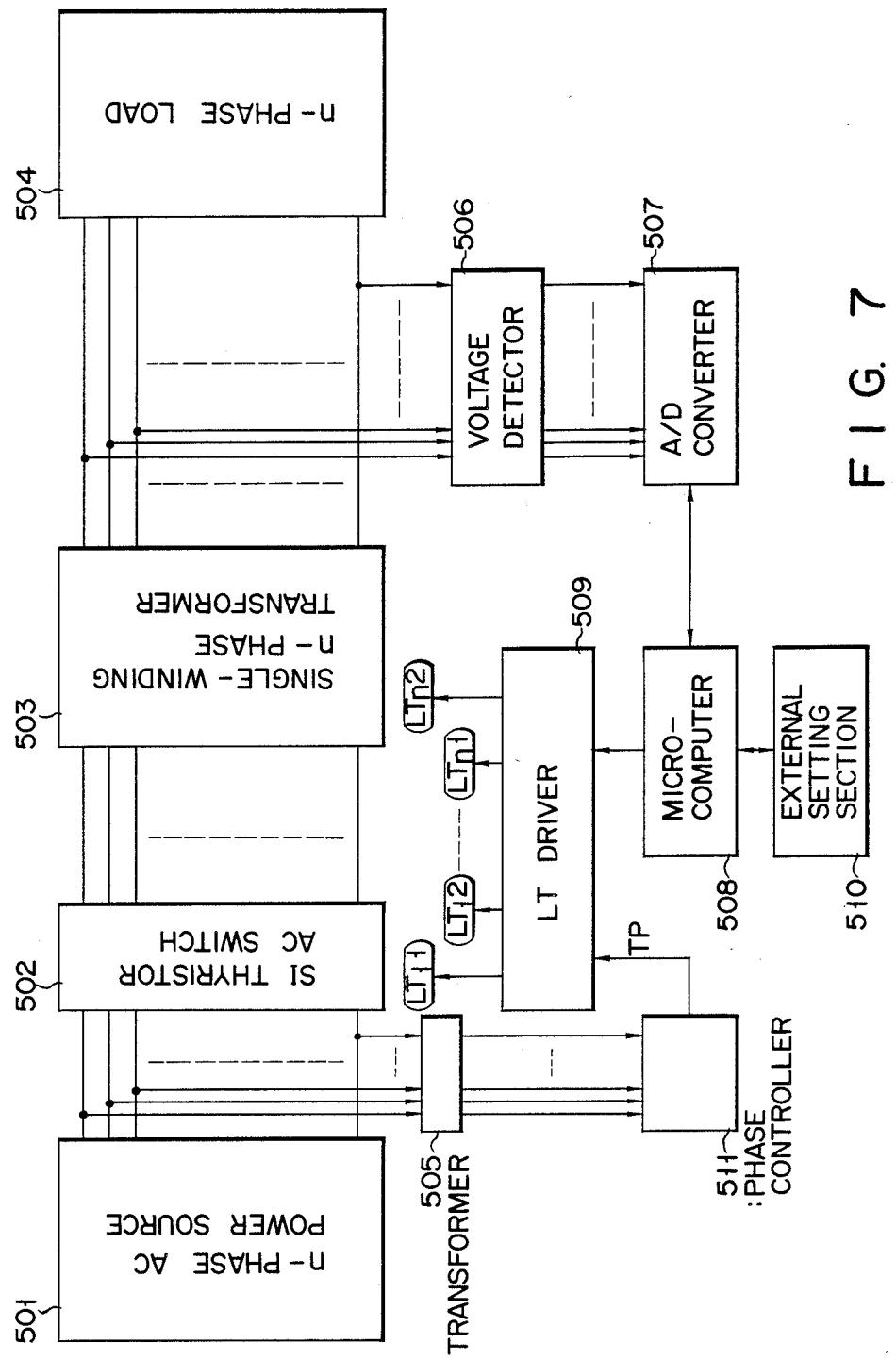
FIG. 7 is a block diagram illustrating the fifth embodiment of this invention.

FIG. 7 illustrates the fifth embodiment, and FIGS. 10 and 11 are detailed circuit diagrams of SI thyristor AC switch group 502 according to the fifth embodiment. The same reference numerals as used for the second embodiment shown in FIG. 3 are also used in FIG. 7 to specify corresponding or identical sections, thus omitting a detailed description thereof.

FIG. 10 illustrates the circuit with the backward breakdown voltage of the SIThy's 1 and 2 being small, and FIG. 11 illustrates the circuit with the backward breakdown voltage of the SIThy's being large.

The numbers of the windings of the taps on the input side and on the output side of a single-winding n-phase transformer shown in FIG. 7 are the same as those in the fourth embodiment, so that their detailed description will be omitted here.

The circuit according to the embodiment of FIG. 7 is controlled in accordance with a program stored in a microcomputer 508. When the program starts, the microcomputer 415 sends to a LT driver 509 control signals for a SI thyristor AC switch 602 (see FIGS. 10 and 11) coupled to the taps of the individual phases of the single-winding n-phase transformer 503.

The LT driver 509 sends light ON signals $LT_l1$ and $LT_l2$, ..., $LT_n1$, $LT_n2$ to the SI thyristor AC switch 602 (FIGS. 10 and 11) of each phase of the single-winding n-phase transformer 503 corresponding to the control signals, to control the flow of the AC current to thereby generate a voltage on the output side of the single-winding n-phase transformer 503.

The microcomputer 508 then sends to an A/D converter 507 a command for A/D conversion of the output voltage from the single-winding n-phase transformer 503. The A/D converter 507 converts the output voltage, which has been converted into a DC voltage through a voltage detector 506, into a digital value and then sends the digital data to the microcomputer 508.

The microcomputer 508 compares the received digital data with a value set by the program or an external setting section 510.

This operation is periodically repeated by the microcomputer for the output voltage between the individual phases of the single-winding n-phase transformer 503 in accordance with the program. When the digital data from the A/D converter 507 continuously deviates from the set value during the operation for a time period set by the program or the external setting section 510, the corresponding tap of the single-winding n-phase transformer is switched to the tap one stage higher or lower than the present stage.

Those of the light ON signals $LT_l1$, $LT_l2$ to $LT_n1$, $LT_n2$ corresponding to the control signals from the microcomputer 508 are interrupted, and the new light ON signals are supplied to the SIThy's 1 and 2 of the SI thyristor AC switches 601 and 603 (see FIGS. 10 and 11) coupled to the tap one stage higher or lower than the present tap of the single-winding n-phase transformer 503, in synchronism with the corresponding timing pulse TP from the phase controller 511. Through the above operation, the tap switching for the phases of the single-winding n-phase transformer 503 which correspond to the control signals from the microcomputer 508, can be executed.

The detailed operation of the tap switching is the same as the one involved in the fourth embodiment, so that its description will be omitted.

The aforementioned embodiments are designed for AC power of a commercially-available frequency. FIGS. 28 and 29 illustrate the turn-on times in the case where the SIThy's 1 and 2 of the first embodiment are controlled by the light ON signals LT1 and LT2: FIG. 28 shows the dependency with respect to the voltage of the input power source 13 while FIG. 29 shows the dependency with respect to the load current IL shown in FIG. 1.

From FIGS. 28 and 29, it should be noted that the greater the voltage increase dv/dt of the input power source 13 (FIG. 1) and the current increase di/dt in load current IL, the shorter the turn-on time. Therefore, this invention can be applied to controlling AC power of a higher frequency. In a case where AC power is controlled by a circuit having the SIThy's 1 and 2 (shown in FIG. 1) coupled in parallel in the opposite bias directions as well as another circuit having ordinary power semiconductor devices coupled in parallel in the opposite bias directions, the turn-off time is such that, even when the polarity of a current flowing through SI thyristors or ordinary power semiconductor devices changes at the time the polarity of an AC current changes, the backward current keeps flowing and gradually decreases to approach the normal backward leak current value. In controlling high-frequency power, therefore, the switching loss originated by this turn-off time increases and there is a limit to the controllable frequency.

In this respect, light- or electric-signal-initiated turn-off mode is employed for the SIThy's 1 and 2 of FIG. 1 which have the self-quenching function of this invention. By forcibly turning off the devices immediately before the polarity of the voltage of the AC power source 13 changes, the turn off time is minimized to reduce the switching loss to thereby increase the limit of the controllable frequency. Accordingly, this invention can be applied to controlling AC power of a high frequency of several kHz to several tens of kHz.

As should be obvious from the above, according to this invention, the flow of an AC current can be controlled by controlling a SI thyristor AC switch having SI thyristors coupled in parallel in the opposite bias direction or a group of SI thyristor AC switches each having the same structure as described above. This invention can easily cope with a change in phase of a current by using a light signal with a relatively long pulse width.

Since, according to the third to fifth embodiments of this invention, the light ON signals for controlling the SI thyristor AC switch group is set to be supplied first to the SIThy 1 or 2, there may be a delay of one cycle period at the maximum until the light ON signals are output after generation of the control signal from the microcomputer. This delay can be reduced to a half the cycle by designing the light trigger (LT) driver as such. Moreover, the response speed can be increased to several μsec by executing the OFF control by means of light or an electric signal.

FIGS. 26 through 28 illustrate distortion factors of voltage waveforms respectively for the taps T1, T2 and T3 of each phase in the third embodiment. FIGS. 26 to 28 show the distortion factors of the input voltage and the output voltage at the time of controlling the SI thyristor AC switches 101, 102 and 103 respectively coupled to the first stage tap T1, second stage tap T2 and third stage tap T3. FIG. 29 show distortion factors between the individual phases in combinations of taps $u_1$, $u_2$, $u_3$, $w_1$, $w_2$ and $w_3$ of the individual stages in the fourth embodiment. (They are low distortion factors of less than 3%.)

According to this invention, therefore, an AC current can be controlled with the mentioned low distortion factors as well as low loss because of the use of SI thyristors having a low loss characteristic. Further, with the employment of the light- or electric-signal-initiated OFF control, an AC chopper and high-frequency power can also be controlled.

What is claimed is:

1. A power control apparatus comprising:
   static induction thyristor AC switch means including at least a pair of static induction thyristors coupled in parallel in mutually opposite bias directions between an AC power source and a load;
   ON control means for turning on said static induction thyristor AC switch means, said ON control means including,
   a first phase control section for outputting a turn-on timing pulse within an ignition phase angle of 180° overlapping a zero-cross point of an AC voltage output from said AC power source, and
   a light trigger driver section for irradiating a light ON signal directly on said pair of static induction thyristors in response to said timing pulse; and
   OFF control means for turning off said static induction thyristor AC switch means, said OFF control means including,
   a phase detecting section for detecting a phase difference between said AC voltage and an AC current output from said AC power source,
   a second phase control section for providing a phase-controlled turn-off timing pulse within a given period of said AC current using phase difference data attained from said phase detecting section and said AC voltage, and
   a light quench driver section for supplying an OFF control signal to said static induction thyristor AC switch means in response to said turn-off timing pulse.

2. A power control apparatus comprising:
   static induction thyristor AC switch means including at least a pair of static induction thyristors coupled in parallel in mutually opposite bias directions between an AC power source and a load; and
   ON control means for turning on said static induction thyristor AC switch means, said ON control means including,
   a phase control section for outputting an ON-control timing pulse 2 msec earlier than a zero-cross point of an AC voltage output from said AC power source and keeps generation of said timing pulse for 5 msec, and
   a light trigger driver section for supplying continuously for 5 msec a light ON signal to said static induction thyristor AC switch means in response to said ON-control timing pulse, said static induction thyristor AC switch means being turned off by natural commutation.

3. A power controlling apparatus comprising:
   a plurality of static induction thyristor AC switch means each including at least a pair of static induction thyristors coupled in parallel in mutually opposite bias directions between an AC power source and a plurality of input side taps of a single-winding transformer;
   light trigger drive means for performing ON control of any one of said plurality of static induction thyristor AC switch means in synchronism with an output AC voltage of said AC power source;
   voltage detecting means for detecting an output voltage of said single-winding transformer; and
   switching means for comparing a detection voltage from said voltage detecting means with a pre-set value and controlling said light trigger drive means to switch which one of said plurality of static induction thyristor AC switch means is to be subjected to ON control, when said detection voltage continuously deviates from said pre-set value for more than a pre-set time.

4. A power control apparatus comprising:
   a system for performing ON control of a pair of static induction thyristors, coupled in parallel in opposite bias directions, by irradiating directly on said static induction thyristors a light signal with a relative long pulse width equivalent to an ignition phase angle of less than or equal to 180° overlapping a zero-cross point of an AC source voltage, and performing OFF control by means of an electric signal.

* * * * *